United States Patent
Malik et al.

(10) Patent No.: US 6,312,870 B1
(45) Date of Patent: Nov. 6, 2001

(54) T-BUTYL CINNAMATE POLYMERS AND THEIR USE IN PHOTORESIST COMPOSITIONS

(75) Inventors: Sanjay Malik, Attleboro; Lawrence Ferreira, Fall River, both of MA (US); Jeffrey Eisele, Cranston; Whewell Allyn, Westerly, both of RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/619,180

(22) Filed: Jul. 19, 2000

(51) Int. Cl.$^7$ ............... G03C 1/73; G03C 5/56; G03F 7/30; C08F 12/24; C08F 18/16
(52) U.S. Cl. ............ 430/270.1; 430/905; 430/909; 430/910; 430/325; 430/326; 526/313; 526/326
(58) Field of Search .................... 526/313, 326; 430/270.1, 905, 909, 910, 325, 326

(56) References Cited

U.S. PATENT DOCUMENTS

| | | | |
|---|---|---|---|
| 4,763,995 | 8/1988 | Katagiri et al. | 350/341 |
| 5,468,589 | 11/1995 | Urano et al. | 430/170 |
| 5,558,978 | 9/1996 | Schadeli et al. | 430/270.1 |
| 5,731,128 | 3/1998 | Kanda et al. | 430/281.1 |
| 5,731,129 | 3/1998 | Koshimura et al. | 430/286.1 |
| 5,736,298 | 4/1998 | Koshimura et al. | 430/287.1 |
| 5,837,421 | 11/1998 | Kanda et al. | 430/281.1 |
| 5,861,232 | 1/1999 | Kanda et al. | 430/281.1 |
| 6,010,825 | 1/2000 | Hagen et al. | 430/283.1 |

FOREIGN PATENT DOCUMENTS 494 383 B1   12/1991   (EP) .

OTHER PUBLICATIONS

Graham et al Preparation and Properties of Polymers of Secondary Alkyl Crotonates and Related Monomers, Journal of Applied Polymer Science, vol. 11, pp. 1797–1805 (1967).*

* cited by examiner

Primary Examiner—Janet Baxter
Assistant Examiner—Sin J. Lee
(74) Attorney, Agent, or Firm—Ohlandt, Greeley, Ruggerio & Perle, LLP

(57) ABSTRACT

A resist composition containing a polymer of t-butyl cinnamate, a photoacid generator, and a solvent. Optionally, the resist composition may include a basic compound.

The polymer of t-butyl cinnamate has the monomeric units:

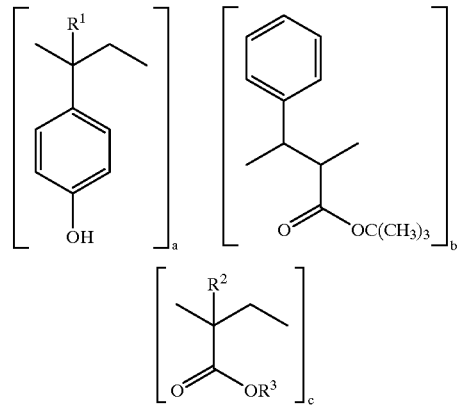

wherein a=0.3 to 0.9, b=0.1 to 0.7, and c=0 to 0.3; $R^1$=H, methyl, or $CH_2OR^4$; $R^4$=H or C1–C4 alkyl group; $R^2$=H, methyl, $CH_2OR^4$, $CH_2CN$, or $CH_2X$; X=Cl, I, Br, F, or $CH_2COOR^5$; $R^5$=C1–C4 alkyl group; and $R^3$=isobornyl, cyclohexyl methyl, cyclohexyl ethyl, benzyl, or phenethyl.

24 Claims, No Drawings

T-BUTYL CINNAMATE POLYMERS AND THEIR USE IN PHOTORESIST COMPOSITIONS

BACKGROUND OF THE INVENTION

1. Field of the Invention

The present invention relates to polymers that are useful in photoresist compositions. More particularly, the present invention relates to polymers containing t-butyl cinnamate useful in photoresist compositions, which produce high resolution photoresist patterns with improved etch resistance.

2. Description of Related Art

Photoresist compositions containing copolymers of t-butyl acrylate or methacrylate, and hydroxy styrene monomers are known in the art.

The t-butyl acrylate moiety retards the alkaline solubility of the resist film in unexposed areas. In the exposed area, photogenerated acid and heat causes decomposition of the t-butyl ester group to a carboxylic acid, enhancing the alkaline solubility of the exposed area of the film. While some lithographic properties, such as shape of profile, linked to alkaline solubility improve as the amount of t-butyl acrylate is increased in the copolymer, other properties such as plasma-etch resistance suffer as the amount of hydroxy styrene is decreased.

Plasma etching is a well known method for producing microstructures on a substrate. Etching of the photoresist must be controlled and precise. Variables that must be considered during this process include power level, temperature, pressure, design, and etchant chemistry. The role of the photoresist also influences the etching process. For example, aromatic groups in a photoresist composition affects the etching stability and etch selectivity. That is, certain polymers in the photoresist composition affect the etch resistance, which is an indication of the etch selectivity. By manipulating the etch selectivity, control and precision of the etching process can be improved.

Accordingly, it is desireable to have a photoresist composition that provides desired shape and profile properties, while demonstrating improved etch resistance, i.e. etch selectivity.

BRIEF SUMMARY OF THE INVENTION

The present invention provides a photosensitive resist composition comprising a polymer of t-butyl cinnamate, a photoacid generator, and a solvent. The polymers of t-butyl cinnamate that are useful in the present invention have monomeric units of:

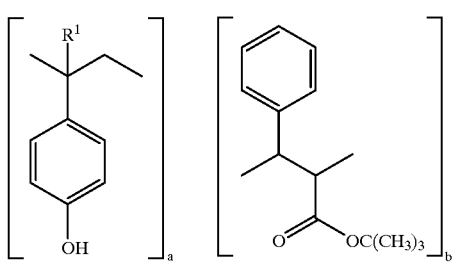

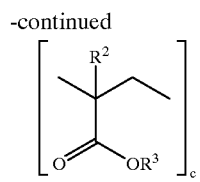

wherein a 0.3 to 0.9, b=0.1 to 0.7, and c=0 to 0.3; $R^1$=H, methyl, or $CH_2OR^4$; $R^4$=H or C1–C4 alkyl group; $R^2$ =H, methyl, $CH_2OR^4$, $CH_2CN$, or $CH_2X$; X=Cl, I, Br, F, or $CH_2COOR^5$; $R^5$=C1–C4 alkyl group; and $R^3$=isobornyl, cyclohexyl methyl, cyclohexyl ethyl, benzyl, or phenethyl.

DETAILED DESCRIPTION OF THE INVENTION

The present invention provides photoresist compositions containing polymers of t-butyl cinnamate that advantageously improves the resolution and shape of a photoresist pattern obtained upon exposure, while exhibiting improved etch resistance. The compositions contain polymers of t-butyl cinnamate, a photoacid generator, and a solvent.

The polymers of t-butyl cinnamate have the monomeric units of:

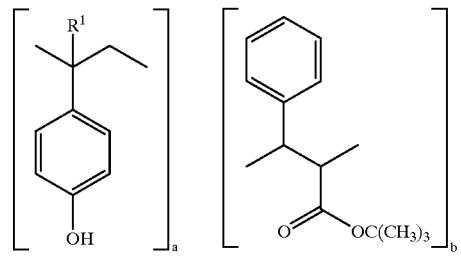

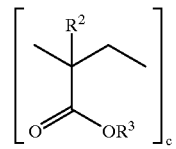

wherein a=0.3 to 0.9, b=0.1 to 0.7, and c=0.3; $R^1$=H, methyl, or $CH_2OR^4$; $R^4$=H or C1–C4 alkyl group; $R^2$=H, methyl, $CH_2OR^4$, $CH_2CN$, or $CH_2X$; X=Cl, I, Br, F, or $CH_2COOR^5$; $R^5$=C1–C4 alkyl group; and $R^3$=isobornyl, cyclohexyl methyl, cyclohexyl ethyl, benzyl, or phenethyl.

These polymers can be prepared by copolymerizing t-butyl cinnamate with acetoxy styrene and subsequently converting the resulting acetoxy styrene/t-butyl cinnamate copolymer to hydroxy styrene/t-butyl cinnamate copolymer, as shown by the following reaction sequence:

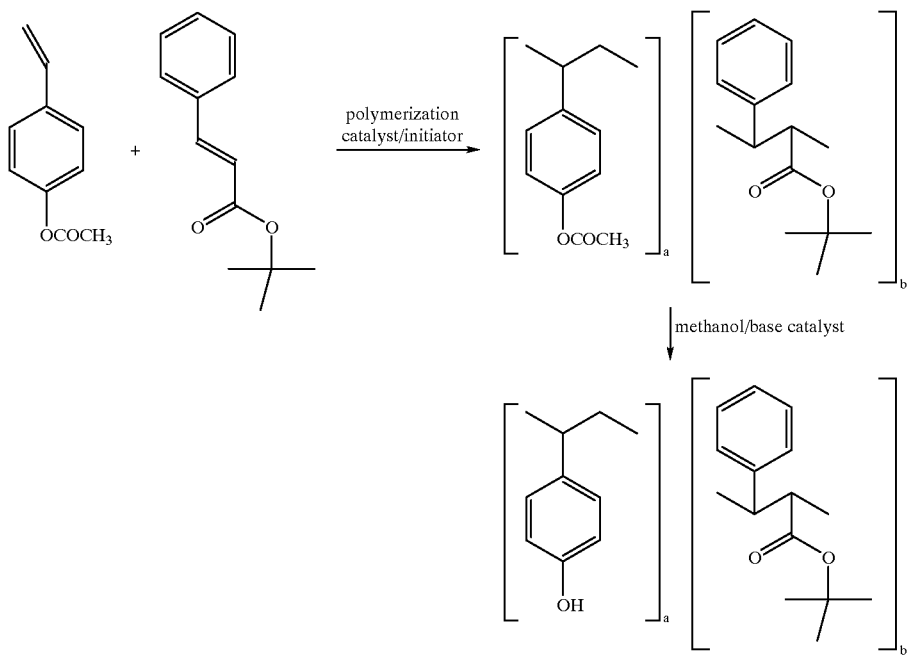

a = 0.3–0.9 and b = 0.1–0.7.

The polymer of t-butyl cinnamate formed in the previously shown reaction, has the monomeric units:

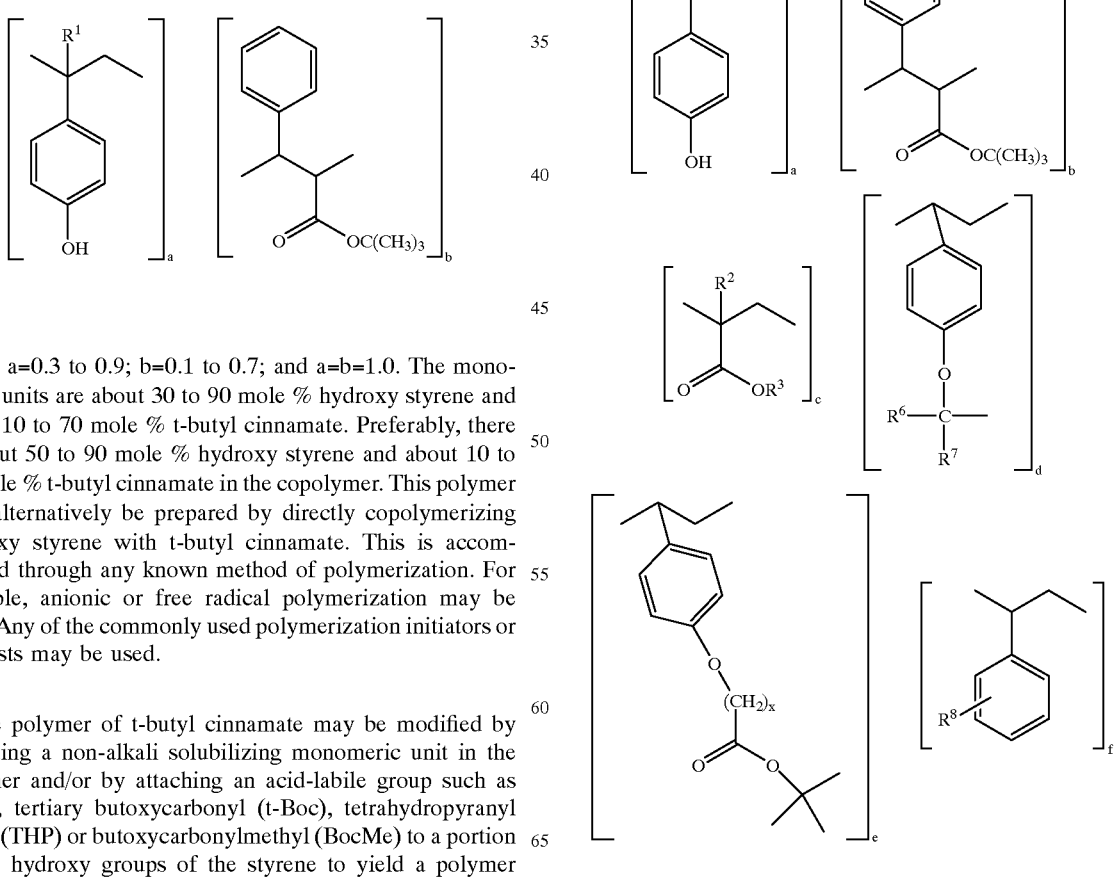

where a=0.3 to 0.9; b=0.1 to 0.7; and a=b=1.0. The monomeric units are about 30 to 90 mole % hydroxy styrene and about 10 to 70 mole % t-butyl cinnamate. Preferably, there is about 50 to 90 mole % hydroxy styrene and about 10 to 50 mole % t-butyl cinnamate in the copolymer. This polymer may alternatively be prepared by directly copolymerizing hydroxy styrene with t-butyl cinnamate. This is accomplished through any known method of polymerization. For example, anionic or free radical polymerization may be used. Any of the commonly used polymerization initiators or catalysts may be used.

The polymer of t-butyl cinnamate may be modified by including a non-alkali solubilizing monomeric unit in the polymer and/or by attaching an acid-labile group such as acetal, tertiary butoxycarbonyl (t-Boc), tetrahydropyranyl esters (THP) or butoxycarbonylmethyl (BocMe) to a portion of the hydroxy groups of the styrene to yield a polymer having the monomeric units:

wherein a=0.3 to 0.9, b=0.1 to 0.7, c=03, d=0 to 0.2, e=0 to 0.2, f=0 to 0.2, and a+b+c+d+e+f=1.0; $R^1$=H, methyl, or $CH_2OR^4$; $R^4$=H or C1–C4 alkyl group; $R^2$=H, methyl, $CH_2OR^4$, $CH_2CN$, or $CH_2X$; X=Cl, I, Br, F, or $CH_2COOR^5$; $R^5$=C1–C4 alkyl group; $R^3$=isobornyl, cyclohexyl methyl, cyclohexyl ethyl, benzyl, or phenethyl; $R^6$=methyl or ethyl; $R^7$=a cyclic or acyclic group selected from a cyclic, bicyclic, linear, or branched alkyl group, halogen substituted alkyl group, aromatic group, substituted aromatic group selected from phenyl, benzyl, phenethyl, naphthyl, or naphthyl ethyl groups which groups optionally contain one or more heteroatoms such as S, O, or N; x is 0 or 1, and $R^8$ is H, C1–C4 alkyl group, C1–C4 alkoxy group, or an acetoxy group.

Preferably, a=0.3 to 0.7, b=01 to 0.7, c=0 to 0.3, d=0 to 0.2, e=0 to 0.2, f=0 to 0.2, and c+d+e+f=0.2 to 0.5.

The non-alkali solubilizing monomer may be, for example, styrene, 3-methyl styrene, tertiary-butyl styrene, acetoxy styrene, methyl(meth)acrylate, isobornyl (meth) acrylate, adamentyl (meth)acrylate, phenyl (meth)acrylate, phenethyl (meth)acrylate, and cyclohexyl acrylate.

In an alternate embodiment, the monomeric unit:

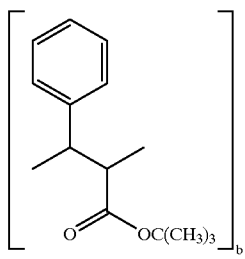

may be replaced with the monomeric unit:

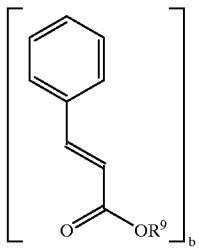

where $R^9$ may be any acid-cleavable hydrocarbon group having 1–10 carbon atoms and b is defined as noted above. Examples include, but are not limited to t-amyl, 2,3-dimethyl butyl, 3-methyl pentyl, 2-methyl adamentyl, 2-ethyl adamentyl, methyl cyclohexyl, and methyl cyclopentyl.

The radiation sensitive composition includes a photoacid generator (PAG), which is also known as a photoinitiator. The function of the PAG is to produce an acid upon exposure to radiation/photolysis. The acid reacts with the polymer to produce alkali soluble carboxylic acid groups in a chemically amplified reaction.

Any suitable photoacid generator compound may be used in the photoresist composition. The photoacid generator compound may be, for example, onium salts such as diazonium, sulfonium, sulfoxonium and iodonium salts, and sulfone compounds, sulfonate compounds, sulfonimide compounds, diazomethane compounds, and disulfones. In addition, suitable photoacid generator compounds are disclosed in U.S. Pat. No. 5,558,978 and U.S. Pat. 5,468,589, which are incorporated herein by reference.

Sulfonium salts such as triphenylsulfonium perfluoro octane sulfonate and triphenylsulfonium perfluoro butane sulfonate are further examples of suitable photoacid generators. A comprehensive listing and description of sulfonium and iodonium photoacid generators that can be included in the present composition is found in U.S. Pat. 6,010,820, which is incorporated herein by reference.

Additional examples of suitable photoacid generators are phenacyl p-methylbenzenesulfonate, benzoin p-toluenesulfonate, α-(p-toluene-sulfonyloxy) methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Other suitable photoacid generator compounds are o-nitrobenzaldehydes, which rearrange on actinic irradiation to give o-nitrosobenzoic acids such as 1-nitrobenzaldehyde and 2,6-nitrobenzaldehyde, α-haloacylphenones such as α,α,α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis (methanesulfonate).

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothipheniumn chloride and 4-hydroxy-2-methylphenylhexahydrothiopyrylium chloride.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis( 1,1-dimethylethylsulfonyl)diazomethane, bis(1-methylethylsulfonyl)diazomethane, bis(cyclohexylsulfonyl) diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl -2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-l-(1, 1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

Other suitable examples of photogenerators are hexafluorotetrabromobisphenol A, 1,1,1-tris(3,5-dibromo4-hydroxyphenyl)ethane and N-(2,4,6-tribromophenyl)-N'-(p-toluenesulfonyl)urea.

In the present invention, the photoacid generator is used at about 0.5 parts to 20 parts by weight per 100 parts of polymer. Preferably, the photoacid generator is included at about 1 to 10 parts, and more preferably about 2 to 8 parts by weight per 100 parts by weight of polymer in the photoresist composition.

The photoresist composition of this invention also includes a solvent. The solvent should be inert, should dissolve all components in the composition, should not undergo reaction with other components, and should be removed on drying after coating. Suitable solvents include, but are not limited to organic solvents, such as propylene glycol monomethyl etheracetate (PGMEA), propylene glycol monomethylether (PGME), 1-methoxy-2-propanol acetate (PMA), N-methylpyrrolidone (NMP), γ-butyrolactone (GBL), N,N-dimethylacetamide (DMAc), dimethyl-2-piperidone, N,N-dimethylformamide (DMF), diglyme, tetrahydrofuran (THF), methyl ethyl ketone, methyl isobutyl ketone, 2-heptanone, cyclopentanione, cyclehexanone, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, 1,4-dioxane, ethylene glycol monoisopropyl ether, diethylene glycol monoethyl ether, diethylene glycol monomethyl ether, diethylene glycol dimethyl ether, and the like. The preferred solvent is propylene glycol monomethyl etheracetate (PGMEA).

Typically, the solvent is about 100 to 1000 parts by weight per 100 parts by weight of polymer in the photoresist composition. Preferably, about 200 to about 800 parts, and more preferably, about 400 to 700 parts by weight per 100 parts by weight of polymer in the photoresist composition is solvent.

Optionally, the composition of the present invention may include a basic compound. The basic compound functions to scavenge protons present in the radiation sensitive composition prior to being irradiated by the actinic radiation. The base prevents attack and cleavage of the acid labile groups by the undesirable acids thereby increasing the performance and stability of the resist. Suitable examples of basic compounds are, for example, 1,5-diazobicyclo[4.3.0]non-5-ene (DBN), 1,8-diazobicyclo[5.4.0]undec-7-ene (DBU), 2,4,5-triphenylimidazole, trimethylpropanetris(2-methyl-aziridinepropionate), 1-cyclohexyl-3-(2-morpholonoethyl)-2-thiourea, 2,8-dimethyl-6H, 12H-5,11-methanodibenzo[b, f][,5]diazocine (Troger's Base), 1-amino-4-piperazine, 4-(3-aminopropyl)morpholine, 2-(aminophenyl)-6-methylbenzothiazole, tribenzylamine, 1,1,4,7,10,10-hexamethyltriethylenetetramine, thiomorpholine, 1,3-bis(3-pyridylmethyl)-2-thiourea, 4,4"-tetramethylenedipiperidine, aniline, N-methylaniline, N,N-dimethylaniline, o-toluidine, m-toluidine, p-toluidine, 2,4-lutidine, quinoline, isoquinoline, formamide, N-methyl-formamide, N,N-dimethylformamide, acetamide, N-methyl-acetamide, N,N-dimethylacetamide, 2-pyrrolidone, N-methylpyrrolidone imidazole, α-picoline, β-picoline, γ-picoline, 1,2-phenylenediamine, 1,3-phenylene-diamine, 1,4-phenylenediamine, 2-amino-4-nitrophenol, and triazines such as 2-(p-chloro-phenyl)-4,6-trichloromethyl-s-triazine, 1,3,5-tribenzylhexahydro-1,3,5-triazine, tetrabutyl ammonium hydroxide, trismethoxy ethylamine and mixtures thereof.

The basic compound may be included at about 1 to 50 parts by weight per 100 parts by weight of the photoacid generator used in the photoresist composition. Preferably the basic compound is included at about 5 to 25 parts by weight, more preferably about 6 to 10 parts by weight per 100 parts by weight of the photoacid generator in the photoresist composition.

The present invention may further include one or more other additives. Suitable additives are, for example, surfactants, adhesion promoters, leveling agents, dyes, mixtures thereof, and the like.

In addition, the present invention includes a process for forming a relief pattern using the composition of the present invention. The process comprises the steps of: (a) coating on a suitable substrate, a photoresist composition comprising a t-butyl cinnamate polymer of this invention, a photoacid generator, and a solvent, thereby forming a coated substrate; (b) drying the photoresist composition; (c) imagewise exposing the coated substrate to actinic radiation; (d) post exposure baking the coated substrate at an elevated temperature; (e) developing the coated substrate with an aqueous developer, thereby forming a relief pattern on an imaged coated substrate; and (f) rinsing the imaged coated substrate.

The photoresist composition of this invention is coated on any suitable substrate such as a silicon wafer, a ceramic substrate, or the like. Coating methods include, but are not limited to spray coating, spin coating, offset printing, roller coating, screen printing, extrusion coating, meniscus coating, curtain coating, and immersion coating. The resulting film may optionally be prebaked at an elevated temperature of about 70–160° C. for one minute to thirty minutes, depending on the method, to evaporate the remaining solvent. Subsequently, the resulting dry film is imagewise exposed to actinic rays in a preferred pattern through a mask. X-rays, KrF-excimer laser, ArF-excimer laser, electron beam, ultraviolet, visible light, and the like can be used as actinic rays. The most preferable rays are those with wavelengths of about 248 nm or less.

Following imagewise exposure to actinic radiation, it is advantageous to heat the coated substrate to a temperature between about 70° C. and 160° C. The coated substrate is heated in this temperature range for a short period of time, typically several seconds to several minutes. This process step is commonly referred to in the art as post exposure baking.

The film is developed by an aqueous developer and a relief pattern is obtained. The aqueous developer includes a solution of alkalis such as an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The most preferred developers are those containing tetramethylammonium hydroxide (TMAH). An appropriate amount of a surfactant can be added to the developer. Development can be carried out by means of immersion, spray, puddling, or other similar developing methods.

The relief pattern is then rinsed using deionized water.

To illustrate the present invention, the following examples are provided. It should be understood that the present invention is not limited to the examples described.

SYNTHESIS EXAMPLE 1

SYSTHESIS OF t-butyl Cinnamate 42.82 Grams (0.289 moles) trans-cinnamic acid and 440 mL of methylene chloride were added to a 2 liter, 3 neck round bottom flask. The mixture was stirred until complete solution was obtained. A solution consisting of 131.56 grams (0.578 moles as 100%) t-butyl 2,2,2-trichloroacetimidate and 1000 mL of cyclohexane was then added to the reaction mixture. Next, 0.8 mL of boron trifluoride etherate was then added. Immediately, a thick white slurry formed. The reaction mixture was stirred at room temperature for 16 hours.

8 Grams of solid sodium bicarbonate was added. The reaction mixture was stirred for 2–3 hours. The mixture was filtered through a pad of silica gel. Methylene chloride and cyclohexane were removed from the filtrate by vacuum distillation. The colorless oil was redissolved in approximately 300 mL of ethyl acetate. The ethyl acetate solution was washed with 6×50 mL portions of 5% sodium hydroxide, followed by 2×50 mL portions of water. The organic phase was dried over magnesium sulfate. The magnesium sulfate was removed by filtration. Ethyl acetate was removed from the filtrate by vacuum distillation to afford 40 grams of a colorless oil. The crude product was purified by distillation under vacuum.

EXAMPLE 1

Synthesis of Copolymer of Hydroxy Styrene and t-butyl Cinnamate

A 500 mL three necked flask was fitted with a temperature probe attached to a temperature controller, an adaptor for nitrogen, and a reflux condenser. The flask was placed in an oil bath over a magnetic stirrer. 21 Grams (35 mole %) of t-butyl cinnamate (as prepared by Synthesis Example 1) and 23 grams (65 mole %) of acetoxy styrene along with 15 mL of p-dioxane and 80 mL isopropyl alcohol were charged into the flask. Nitrogen gas was bubbled through the monomer solution for 30 minutes. The contents were stirred and the temperature of the reaction mixture was raised to 60° C. 1.4 Grams of benzoyl peroxide was added and the reaction temperature was gradually increased to 78° C. After 20 hours, the reaction contents were allowed to cool to 24° C. The copolymer formed was isolated from its solution by precipitation in 1200 mL of hexanes. The isolated polymer was washed with 800 mL of hexanes, filtered, and dried in a vacuum oven.

A 500 mL three-necked flask was fitted with a temperature probe attached to a temperature controller, an adaptor for nitrogen, and a Dean-Stark apparatus with reflux condenser. 28 Grams of the dried polymer was suspended in 105 mL of methanol. 3 Grams of 10% sodium methoxide solution in methanol was added. The temperature of the reaction mixture was raised to 66° C. Methyl acetate formed and was removed by azeotropic distillation with methanol. The conversion of acetoxy styrene to hydroxy styrene was monitored by disappearance of the IR peak at 1765 $cm^{-1}$. After completion of the reaction, the reaction mixture was cooled to room temperature (19° C.). The base-catalyst was removed by stirring the solution with 10 grams of Amberlyst ion-exchange (A-15) resin [Aldrich Chemicals, Cat. No. 21,638-0, p. 58, 1996–1997] for 2 hours. The ion-exchange resin was removed by filtration. Hydroxy styrene/t-butyl cinnamate copolymer was isolated by precipitation in 1200 mL of de-ionized water. The isolated polymer was washed three times with 100 mL de-ionized water, filtered, and dried in a vacuum oven at 60° C. for 24 hours.

The copolymer contained 36 mole % of t-butyl cinnamate as determined by $^1$H- and $^{13}$C-NMR and had a Mw of 8,900.

EXAMPLES 2 to 6

The polymers prepared in Examples 2, 3, 4, 5, and 6 were synthesized following a procedure similar to the one described in Example 1, with the following modifications: (a) in Example 2 the monomer feedstock consisted of: 25 mole % t-butyl cinnamate, 65 mole % acetoxy styrene, and 10 mole % of phenethyl acrylate, (b) in Example 3 the monomer feedstock consisted of: 25 mole % t-butyl cinnamate, 60 mole % acetoxy styrene, and 15 mole % of t-butyl styrene, (c) in Example 4 the monomer feedstock consisted of: 20 mole % t-butyl cinnamate, 65 mole % acetoxy styrene, and 15 mole % of styrene, (d) in Example 5 the monomer feedstock consisted of: 20 mole % t-butyl cinnamate, 65 mole % acetoxy styrene, and 15 mole % of isobornyl acrylate, and (e) in Example 6 the monomer feedstock consisted of: 15 mole % t-butyl cinnamate, 70 mole % acetoxy styrene, and 15 mole % of isobornyl acrylate. The descriptions of the synthesized polymers are given in Table 1.

TABLE 1

| Example | Monomer Composition in Feedstock (mole %) | | Polymer Composition $^1$H & $^{13}$C-NMR (mole %) | | Mw | PD | Tg (° C.) |
|---|---|---|---|---|---|---|---|
| 2 | t-butyl cinnamate: | 25 | t-butyl cinnamate: | 25 | 9,900 | 2.1 | 126 |
|   | Acetoxy Styrene: | 65 | Hydroxy Styrene: | 65 |  |  |  |
|   | Phenethyl acrylate: | 10 | Phenethyl acrylate: | 10 |  |  |  |
| 3 | t-butyl cinnamate: | 25 | t-butyl cinnamate: | 25 | 11,438 | 2.33 | — |
|   | Acetoxy Styrene: | 60 | Hydroxy Styrene: | 60 |  |  |  |
|   | t-butyl styrene: | 15 | t-butyl styrene: | 15 |  |  |  |
| 4 | t-butyl cinnamate: | 20 | t-butyl cinnamate: | 22 | 12,935 | 2.62 | 92 |
|   | Acetoxy Styrene: | 65 | Hydroxy Styrene: | 65 |  |  |  |
|   | Styrene: | 15 | Styrene: | 13 |  |  |  |
| 5 | t-butyl cinnamate: | 20 | t-butyl cinnamate: | 20 | 25,954 |  |  |
|   | Acetoxy Styrene: | 65 | Hydroxy Styrene: | 65 |  |  |  |
|   | Isobornyl acrylate: | 15 | Isobornyl acrylate: | 15 |  |  |  |
| 6 | t-butyl cinnamate: | 15 | t-butyl cinnamate: | 14 | 18,351 | 2.3 |  |
|   | Acetoxy Styrene: | 70 | Hydroxy Styrene: | 73 |  |  |  |
|   | Isobornyl acrylate: | 15 | Isobornyl acrylate: | 13 |  |  |  |

EXAMPLE 7

Lithographic Evaluation of t-butyl Cinnamate Containing Polymers

Preparation of Photoresist Formulations:

The resist components were blended in amber colored glass bottles. All the components are the same for all the formulation, unless stated otherwise. The resist component blends were as follows:

| Formulation Type | Polymer* (amount) | PAG used (amount) | Base used (amount) | Solvent (amount) |
|---|---|---|---|---|
| I | 12.94 g | Triphenylsulfonium 2,4,6-triisopropyl benzenesulfonate (0.54 g) | 1,5-diazobicyclo [4.3.0]non-5-ene(0.019 g) | PGMEA (86.5 g) |
| II | 12.88 g | Triphenylsufonium-dodecylbenzene sulfonate (0.61 g) | 1,5-diazobicyclo [4.3.0]non-5-ene(0.014 g) | PGMEA (86.5 g) |

*t-butyl cinnamate containing polymer solution in 1-methoxy-2-propylene acetate (25% solution) (12.94 g)

All components were weighed on an electronic balance having an accuracy to 0.01 grams. When all the components had dissolved, the resist samples were micro filtered directly into clean bottles.

Coating, Baking, Exposure, Post Exposure Baking, and Developing of the Photo resists:

The following general procedure was followed for the development of a positive tone image:

The wafers were spin coated by applying 3 mL of photoresist formulations to the static six-inch wafers. The wafer was then spun to give a uniform film thickness of about 4900 Å. These photoresist coated wafers were then softbaked at 140° C. for 60 seconds to remove the residual solvents. The softbaked photoresist coated wafers were then exposed using 248 nm wavelength light on an ISI XLS 0.53 NA stepper. After completion of exposure, the wafers were subjected to a post exposure bake (PEB) at 140° C. for 60 seconds. Following the PEB, the wafers were puddle or spray-developed using a 0.262 N tetramethylammonium hydroxide (TMAH), aqueous developer. A deionized water rinse was applied for 20 seconds while spinning, followed by dry nitrogen gas to dry the wafer.

Each imaged photoresist-coated substrate was evaluated for several important properties, such as optimum photospeed (E1:1) and line space pair resolution (resolution).

Photoresist Evaluations:

The lithographic properties of the line-space pairs of the photoresist formulations are summarized in Table 2:

TABLE 2

| Polymer system from Table I | E1:1 mJ/cm$^2$ | Feature Type | Formulation Type | Resolution μm |
|---|---|---|---|---|
| Example 6 | 56 | Isolated line | I | 0.13 |
| Example 3 | 35 | Dense line | I | 0.16 |
| Example 1 | 37 | Dense line | II | 0.16 |

Etch Selectivity

The plasma etching studies were carried out on a LAM TCP-9400 etcher. Etching conditions were set at 700 W (source), −20° C.; 200 sccm Ar, 8 sccm $CF_4$, 12 sccm $CHF_3$; and pressure 700 m torr.

The oxide etch selectivity of the polymer of Example 6 in the photoresist formulation of Example 7 was compared with a similar photoresist composition having a terpolymer containing 61% hydroxy styrene, 26% tertiary-butyl acrylate and 13% isobornyl acrylate (reference polymer).

The resists were formulated, coated, and exposed as described above. The substrates used were 100 nm of polysilicon, and 60 nm of an organic Bottom Antireflective Coating (BARC) [(DUV-30 of Brewer Science]. After etching through 60 nm of the BARC and 100 nm of polysilicon, the tertiary-butyl cinnamate polymer of Example 6 lost only 11% of the original film thickness compared to 30% film loss by the reference polymer-containing resist. This demonstrates the superior etch resistance properties of the tertiary-butyl cinnamate polymer of this invention over the reference polymer.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A photosensitive resist composition comprising:

a polymer of t-butyl cinnamate having monomeric units of:

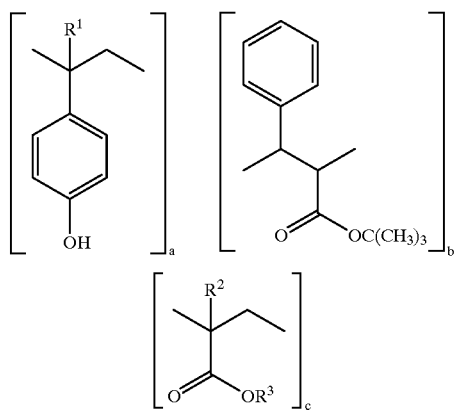

wherein a=0.3 to 0.9, b=0.1 to 0.7, and c=0 to 0.3; $R^1$=H, methyl, or $CH_2OR^4$; $R^4$=H or C1–C4 alkyl group; $R^2$=H, methyl, $CH_2OR^4$, $CH_2CN$, or $CH_2X$; X=Cl, I, Br, F, or $CH_2COOR^5$; $R^5$=C1–C4 alkyl group; and $R^3$=isobornyl, cyclohexyl methyl, cyclohexyl ethyl, benzyl, or phenethyl; a photoacid generator; and a solvent.

2. The composition of claim 1, wherein said polymer of t-butyl cinnamate has monomeric units of t-butyl cinnamate, hydroxy styrene, and phenethyl acrylate.

3. The composition of claim 1, wherein said polymer of t-butyl cinnamate has monomeric units of t-butyl cinnamate, hydroxy styrene, and isobornyl acrylate.

4. The composition of claim 1, wherein said polymer of t-butyl cinnamate further comprises monomeric units of:

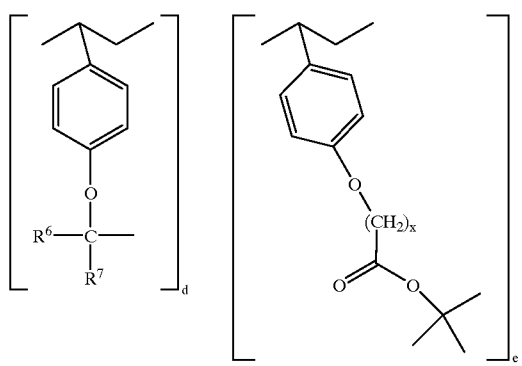

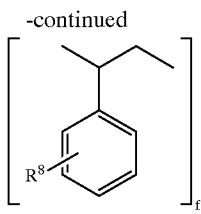

wherein d=0 to 0.2, e=0 to 0.2, f=0 to 0.2, a+b+c+d+e+f=1.0, c+d+e+f=0.2 to 0.5; $R^6$=methyl or ethyl; $R^7$=a cyclic or acyclic group selected from a cyclic, bicyclic, linear, or branched alkyl group, halogen substituted alkyl group, aromatic group, substituted aromatic group selected from phenyl, benzyl, phenethyl, naphthyl, or naphthyl ethyl groups which groups optionally contain one or more heteroatoms; x is 0 or 1; and $R^8$=H, C1–C4 alkyl group, C1–C4 alkoxy group, or an acetoxy group.

5. The composition of claim 4, wherein a=0.3 to 0.7 and b=0.1 to 0.7.

6. The composition of claim 4, wherein said polymer of t-butyl cinnamate has monomeric units of t-butyl cinnamate, hydroxy styrene, and t-butyl styrene.

7. The composition of claim 4, wherein said polymer of t-butyl cinnamate has monomeric units of t-butyl cinnamate, hydroxy styrene, and styrene.

8. The composition of claim 1, wherein said photoacid generator is selected from the group consisting of: onium salts, sulfone compounds, sulfonate compounds, sulfonimide compounds, diazomethane compounds, disulfones, and mixtures thereof.

9. The composition of claim 1, wherein said photoacid generator is triphenylsulfonium-2,4,6-triisopropylphenyl sulfonate.

10. The composition of claim 1, wherein said photoacid generator is about 0.5 parts to 20 parts by weight per 100 parts by weight of said polymer.

11. The composition of claim 1, wherein said solvent is selected from the group consisting of propylene glycol monomethyl etheracetate, propylene glycol monomethylether, 1-methoxy-2-propanol acetate, N-methylpyrrolidone, γ-butyrolactone, N,N-dimethylacetamide, dimethyl-2-piperidone, N,N-dimethylformamide, diglyme, tetrahydrofuran, methyl ethyl ketone, methyl isobutyl ketone, 2-heptanone, cyclopentanone, cyclohexanone, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, 1,4-dioxane, ethylene glycol monoisopropyl ether, diethylene glycol monoethyl ether, diethylene glycol monomethyl ether, diethylene glycol dimethyl ether, and mixtures thereof.

12. The composition of claim 11, wherein said solvent is propylene glycol monomethyl etheracetate.

13. The composition of claim 1, wherein said solvent is about 100 parts to 1000 parts by weight per 100 parts by weight of said polymer.

14. The composition of claim 1, further comprising a basic compound.

15. The composition of claim 14, wherein said basic compound is selected from the group consisting of 1,5-diazobicyclo[4.3.0]non-5-ene, 1,8-diazobicyclo[5.4.0] undec-7-ene, 2,4,5-triphenylimidazole, trimethylpropanetris (2-methyl-aziridinepropionate), 1-cyclohexyl-3-(2-morpholinoethyl)-2-thiourea, Troger's Base, 1-amino-4-piperazine, 4-(3-aminopropyl)morpholine, 2-(aminophenyl)-6-methylbenzothiazole, tribenzylamine, 1,1,4,7,10,10-hexamethyltriethylenetetramine, thiomorpholine, 1,3-bis(3-pyridylmethyl)-2-thiourea, 4,4"-tetramethylenedipiperidine, aniline, N-methylaniline, N,N-dimethylaniline, o-toluidine, m-toluidine, p-toluidine, 2,4-lutidine, quinoline, isoquinoline, formamide, N-methyl-formamide, N,N-dimethylformamide, acetmide, N-methyl-acetamide, N,N-dimethylacetamide, 2-pyrrolidone, N-methylpyrrolidone imidazole, α-picoline, β-picoline, γ-picoline, o-aminobenzoic acid, m-aminobenzoic acid, p-aminobenzoic acid, 1,2-phenylenediamine, 1,3-phenylene-diamine, 1,4-phenylenediamine, 2-quinolinecarboxylic acid, 2-amino-4-nitrophenol, and triazines such as 2-(p-chloro-phenyl)-4,6-trichloromethyl-s-triazine, 1,3,5-tribenzylhexahydro-1,3,5-triazine, tetrabutyl ammonium hydroxide, trismethoxy ethylamine and mixtures thereof.

16. The composition of claim 14, wherein said basic compound is about 1 part to 50 parts by weight per 100 parts by weight of said phototacid generator.

17. The composition of claim 1, further comprising at least one component selected from the group consisting of surfactants, adhesion promoters, leveling agents, dyes, and mixtures thereof.

18. A polymer of t-butyl cinnamate having the monomeric units of:

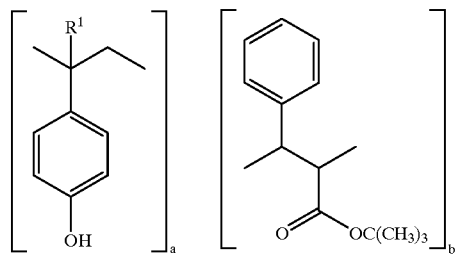

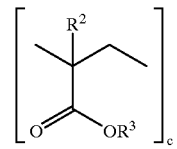

wherein a=0.3 to 0.9, b=0.1 to 0.7, and c=0 to 0.3; $R^1$=H, methyl, or $CH_2OR^4$; $R^4$=H or C1–C4 alkyl group; $R^2$=H, methyl, $CH_2OR^4$, $CH_2CN$, or $CH_2X$; X=Cl, I, Br, F, or $CH_2COOR^5$; $R^5$=C1–C4 alkyl group; and $R^3$=isobornyl, cyclohexyl methyl, cyclohexyl ethyl, benzyl, or phenethyl.

19. The polymer of claim 18, wherein said polymer of t-butyl cinnamate further comprises monomeric units of:

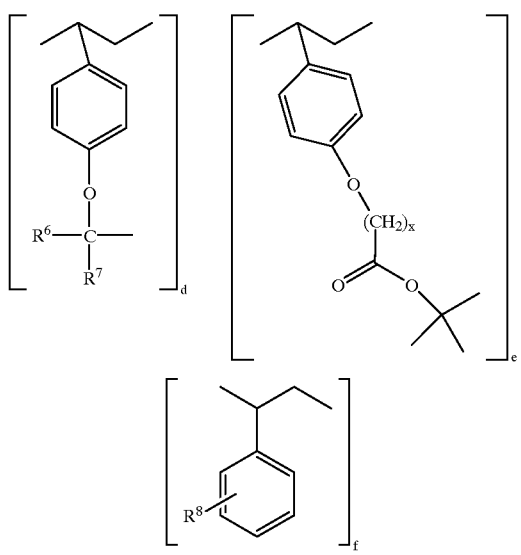

wherein d=0 to 0.2, e=0 to 0.2, f=0 to 0.2, a+b+c+d+e+f=1.0, c+d+e+f=0.2 to 0.5; $R^6$=methyl or ethyl; $R^7$=a cyclic or acyclic group selected from a cyclic, bicyclic, linear, or branched alkyl group, halogen substituted alkyl group, aromatic group, substituted aromatic group selected from phenyl, benzyl, phenethyl, naphthyl, or naphthyl ethyl groups which groups optionally contain one or more heteroatoms; x is 0 or 1; and $R^8$=H, C1–C4 alkyl group, C1–C4 alkoxy group, or an acetoxy group.

20. The polymer of claim 19, wherein a=0.3 to 0.7 and b=0.1 to 0.7.

21. A process for forming a relief pattern, comprising the steps of:
   a) coating on a substrate, the photoresist composition of claim 1, thereby forming a coated substrate;
   b) imagewise exposing said coated substrate to actinic radiation;
   c) post exposure baking said coated substrate at an elevated temperature;
   d) developing said coated substrate with an aqueous developer, thereby forming an imaged substrate; and
   e) rinsing said imaged substrate.

22. The process of claim 21, wherein said polymer of t-butyl cinnamate further comprises monomeric units of:

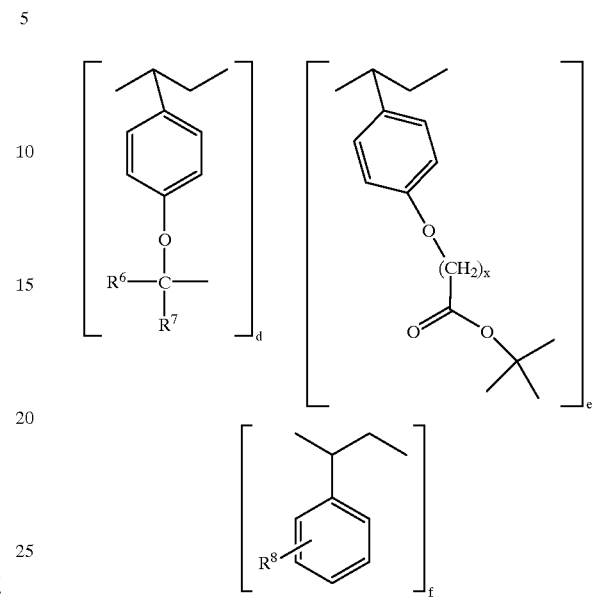

wherein d=0 to 0.2, e=0 to 0.2, f=0 to 0.2, a+b+c+d+e+f=1.0, c+d+e+f=0.2 to 0.5; $R^6$=methyl or ethyl; $R^7$=a cyclic or acyclic group selected from a cyclic, bicyclic, linear, or branched alkyl group, halogen substituted alkyl group, aromatic group, substituted aromatic group selected from phenyl, benzyl, phenethyl, naphthyl, or naphthyl ethyl groups which groups optionally contain one or more heteroatoms; x is 0 or 1; and $R^8$=H, C1–C4 alkyl group, C1–C4 alkoxy group, or an acetoxy group.

23. The process of claim 22, wherein a=0.3 to 0.7 and b=0.1 to 0.7.

24. The process of claim 21, wherein said photoresist composition further comprises a basic compound.

* * * * *